(12) United States Patent
Li et al.

(10) Patent No.: US 10,863,624 B2
(45) Date of Patent: Dec. 8, 2020

(54) CAMERA MODULE WITH REDUCED LIGHT LEAKAGE AND ELECTRONIC DEVICE USING SAME

(71) Applicant: TRIPLE WIN TECHNOLOGY(SHENZHEN) CO.LTD., Shenzhen (CN)

(72) Inventors: Jing-Wei Li, Guangdong (CN); Shin-Wen Chen, New Taipei (TW); Yu-Shuai Li, Shenzhen (CN); Jian-Chao Song, Guangdong (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/289,021

(22) Filed: Feb. 28, 2019

(65) Prior Publication Data

US 2020/0120802 A1 Apr. 16, 2020

(30) Foreign Application Priority Data

Oct. 16, 2018 (CN) .......................... 2018 1 1204772

(51) Int. Cl.
  *H05K 1/14* (2006.01)
  *H05K 1/18* (2006.01)
  *H04N 5/225* (2006.01)

(52) U.S. Cl.
  CPC ........... *H05K 1/148* (2013.01); *H04N 5/2254* (2013.01); *H05K 1/145* (2013.01); *H05K 1/181* (2013.01); *H05K 2201/10121* (2013.01)

(58) Field of Classification Search
  CPC ...... H04N 5/2254; H05K 1/148; H05K 1/145; H05K 1/181; H05K 2201/10121
  USPC ......................................................... 174/260
  See application file for complete search history.

(56) References Cited

U.S. PATENT DOCUMENTS

2008/0252774 A1* 10/2008 Chen .................... H04N 5/2254
348/374

FOREIGN PATENT DOCUMENTS

CN 106291860 A 1/2017

* cited by examiner

*Primary Examiner* — Tremesha S Willis
(74) *Attorney, Agent, or Firm* — ScienBiziP, P.C.

(57) ABSTRACT

A camera module with reduced light leakage includes a printed circuit board and a mounting bracket mounted on the printed circuit board. The printed circuit board includes a first surface and at least one side surface perpendicularly connected to the first surface. A step is defined at the printed circuit board. The step passes through the first surface and at least one side surface. A flange is defined on the mounting bracket. The flange is received and fixed in the step and this structure places less reliance on the strength and opacity of the particular adhesive used.

17 Claims, 14 Drawing Sheets

CAMERA MODULE WITH REDUCED LIGHT LEAKAGE AND ELECTRONIC DEVICE USING SAME

FIELD

The subject matter of the application generally relates to cameras.

BACKGROUND

Better reliability and quality are constantly expected.

Most camera modules have a lens, a motor, a filter, a sensor chip, a base, and a circuit board. Currently, the base is mounted to the circuit board by optical adhesives. However, the materials of the optical adhesives are limited by miniaturization requirements, such that the width, thickness, and optical properties of the optical adhesives do not meet the strength and opacity requirements of the camera module. Light leakage most likely will occur.

Thus, there is room for improvement in the art.

BRIEF DESCRIPTION OF THE DRAWINGS

Implementations of the present disclosure will now be described, by way of embodiments, with reference to the attached figures.

DETAILED DESCRIPTION

Figure 1:
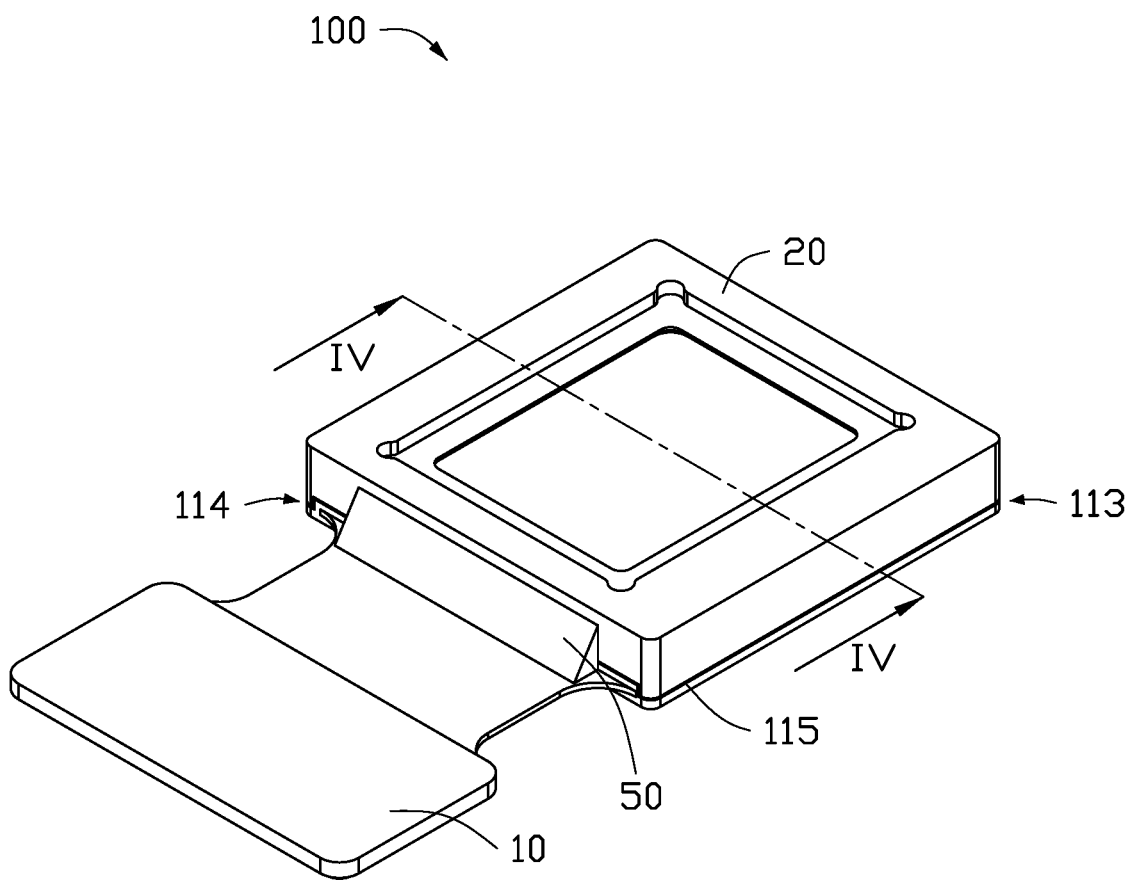
FIG. 1 is a perspective view of a first embodiment of a camera module, according to the present disclosure.
Figure 2:
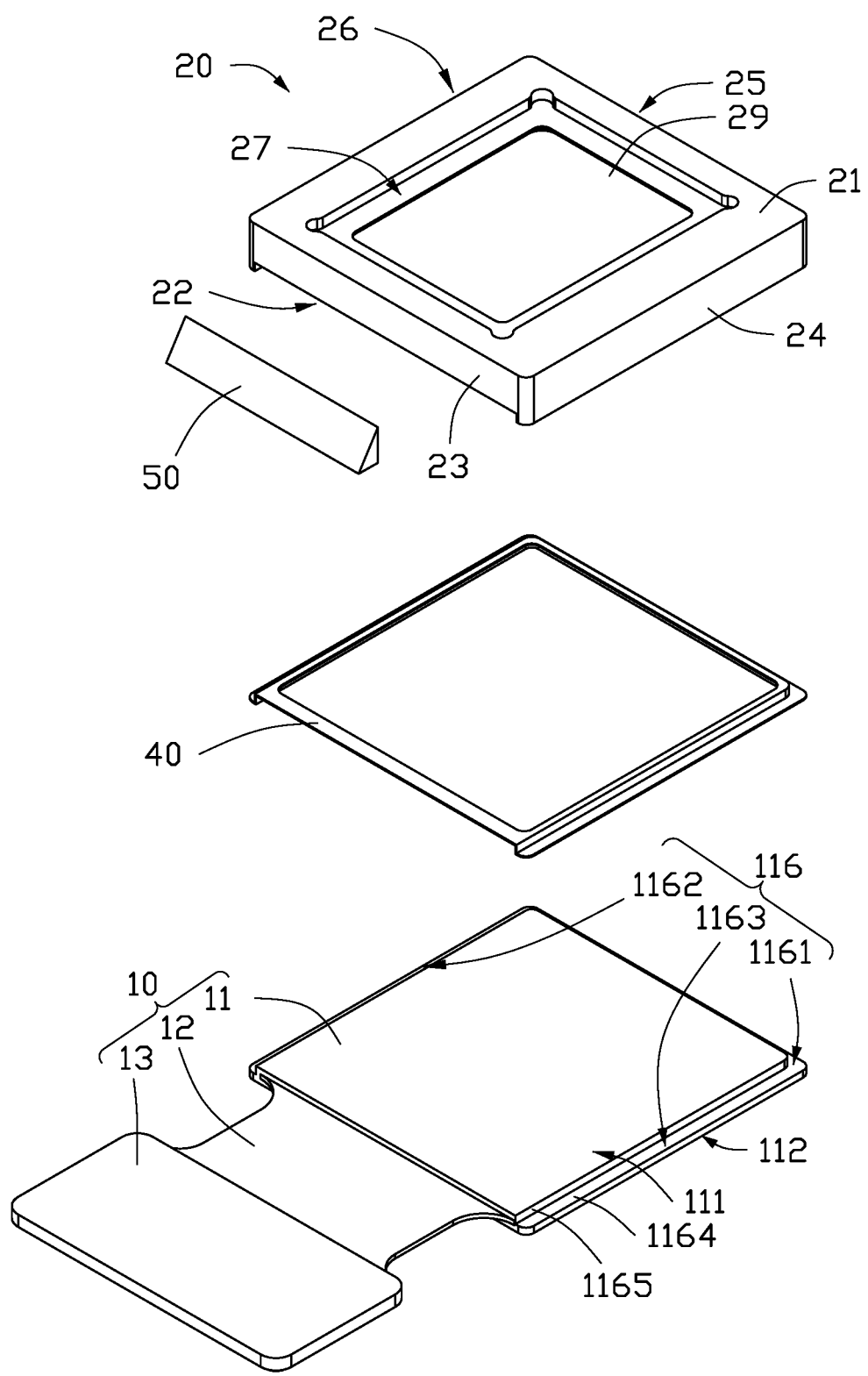
FIG. 2 is an exposed view of the camera module of FIG. 1.
Figure 3:
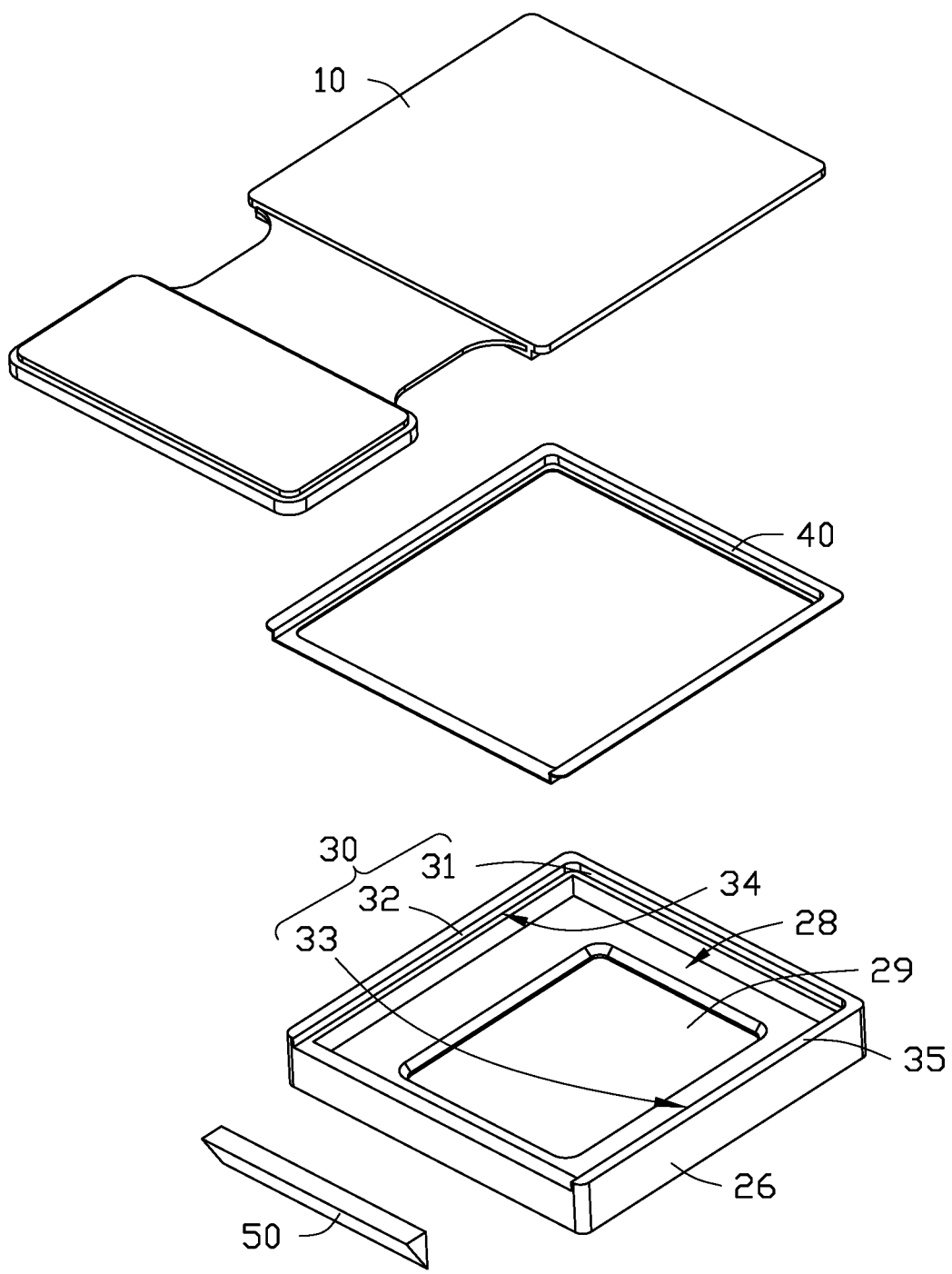
FIG. 3 is an exposed view of the camera module of FIG. 1 from another angle.
Figure 4:
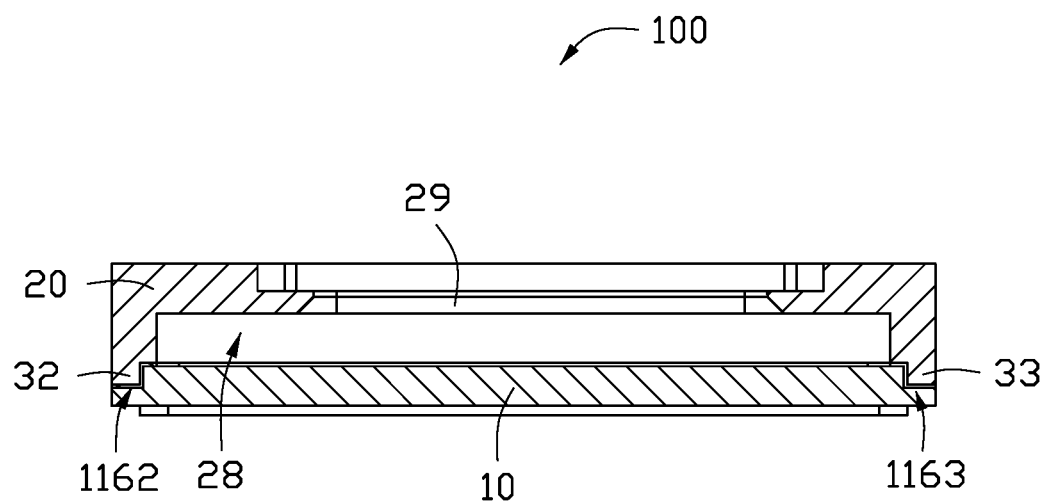
FIG. 4 is a cross-section view along line IV-IV of FIG. 1.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain portions may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 5:
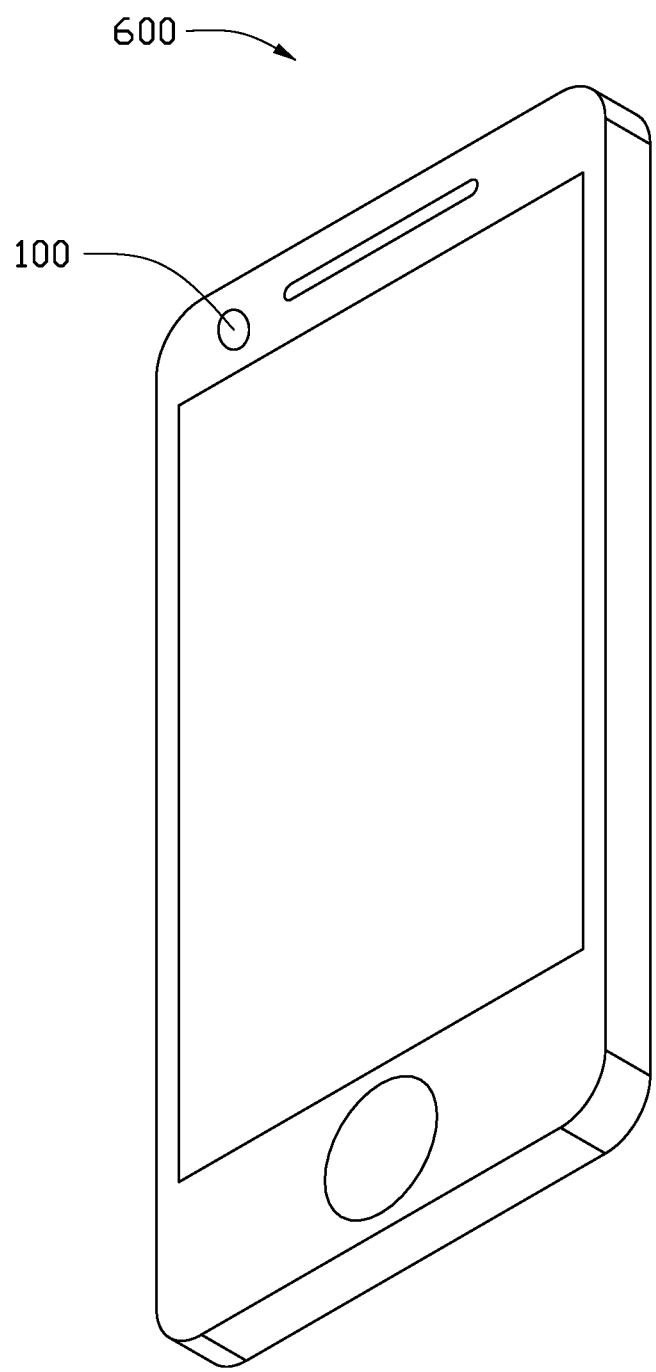
FIG. 5 is a perspective view of an electronic device including the camera module of FIG. 1.
Figure 6:
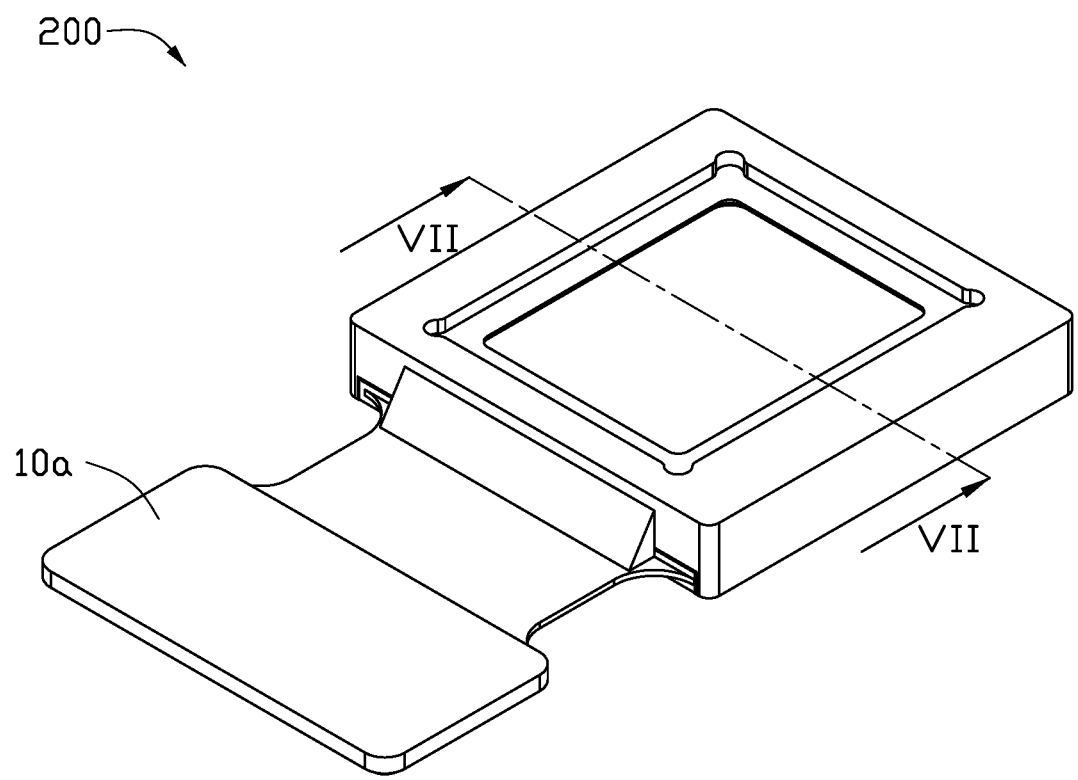
FIG. 6 is a perspective view of a second embodiment of a camera module according to the present disclosure.
Figure 7:
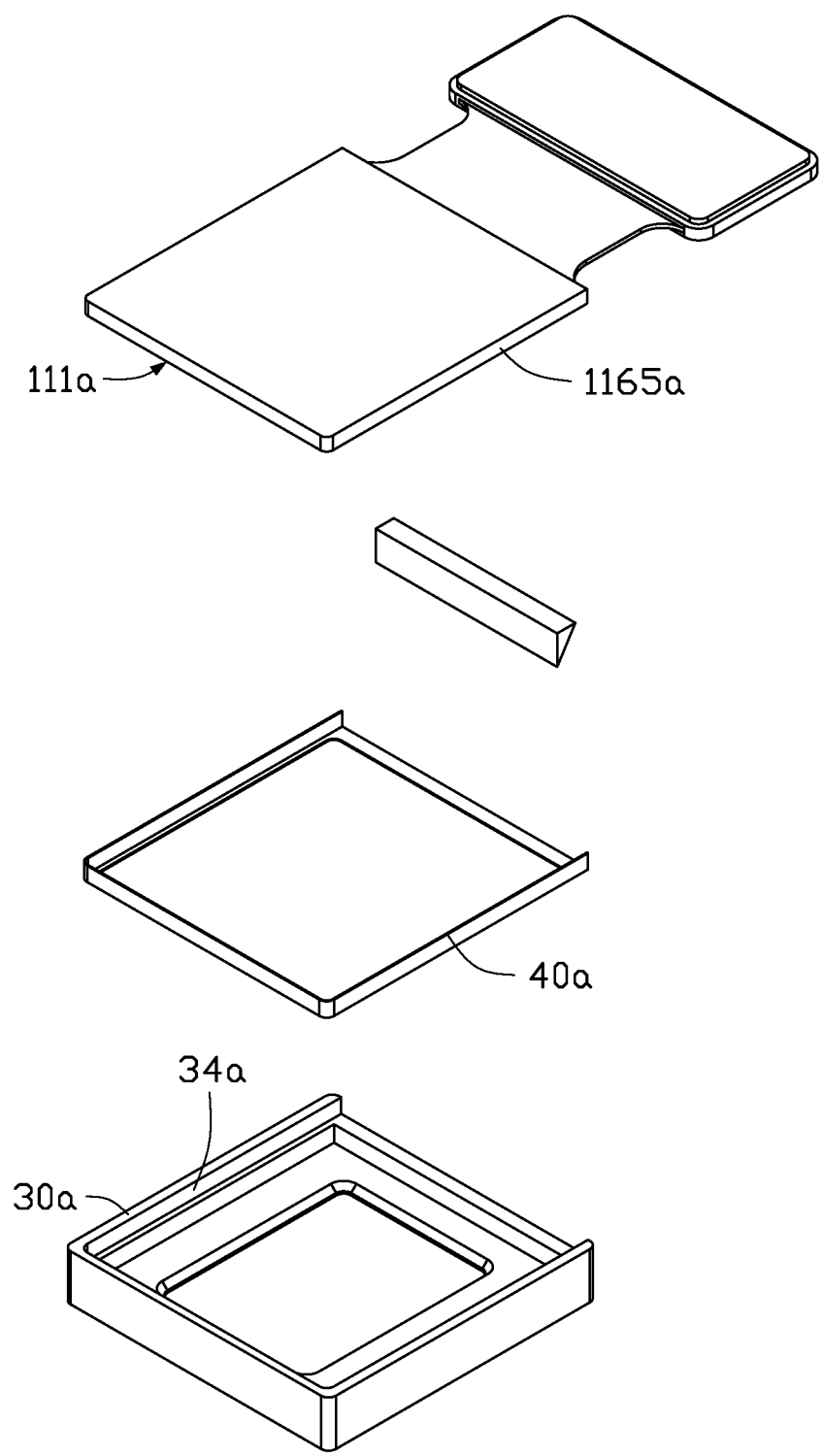
FIG. 7 is an exposed view of the camera module of FIG. 6.
Figure 8:
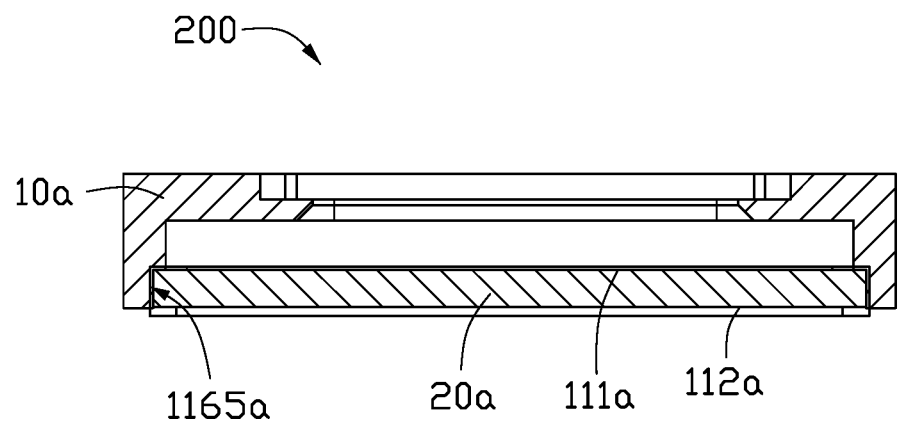
FIG. 8 is a cross-section view along line VII-VII of FIG. 7.

FIGS. 1-4 show a camera module 100. The camera module 100 can be installed in an electronic device 600 (shown in FIG. 5). The electronic device 600 may be a smart phone, a tablet computer, or the like. The electronic device 600 includes the camera module 100.

In at least one embodiment, the camera module 100 includes a printed circuit board 10, a mounting bracket 20, a lens (not shown), an optical filter (not shown), and a sensor (not shown). The lens is mounted on the mounting bracket 20. The mounting bracket 20 is mounted on the printed circuit board 10 by an adhesive layer 40. The optical filter is received in the mounting bracket 20 and faces the lens. The sensor is mounted on the printed circuit board 10 and faces the optical filter.

The printed circuit board 10 may be a ceramic substrate, a flexible printed circuit board, a rigid printed circuit board, a rigid-flex printed circuit board, or the like. In at least one embodiment, the printed circuit board 10 is a rigid-flex printed circuit board.

In at least one embodiment, the printed circuit board 10 includes a first rigid portion 11, a second rigid portion 12, and a flexible portion 13. The flexible portion 13 is located between the first rigid portion 11 and the second rigid portion 12. The sensor is mounted on the first rigid portion 11. The mounting bracket 20 is mounted on the first rigid portion 11.

The first rigid portion 11 includes a first surface 111, a second surface 112, a first side surface 113, a second side surface 114, and a third side surface 115. The second surface 112 is opposite to the first surface 111. The first side surface 113 is perpendicularly connected to the first surface 111 and the second surface 112. The second side surface 114 is perpendicularly connected to the first surface 111, the second surface 112, and the first side surface 113. The third side surface 115 is opposite to the second side surface 114. The sensor is mounted on the first surface 111 of the first rigid portion 11. The mounting bracket 20 is mounted on the first surface 111 of the first rigid portion 11 by the adhesive layer 40.

A step 116 is defined at the first rigid portion 11. The step 116 is located at the peripheral edge of the first rigid portion 11. The step 116 includes a first stepping portion 1161, a second stepping portion 1162, and a third stepping portion 1163. The second stepping portion 1162 is perpendicularly connected to the first stepping portion 1161. The third stepping portion 1163 is perpendicularly connected to the second stepping portion 1162 and is opposite to the first stepping portion 1161.

The first stepping portion 1161 abuts the first side surface 113. The second stepping portion 1162 abuts the second side surface 114. The third stepping portion 1163 abuts the third side surface 115.

The first stepping portion 1161, the second stepping portion 1162, and the third stepping portion 1163 are formed from the first surface 111 to the second surface 112.

In at least one embodiment, the first stepping portion 1161 passes through the first surface 111 and the first side surface 113. The second stepping portion 1162 passes through the first surface 111 and the second side surface 114, and the third stepping portion 1163 passes through the first surface 111 and the third side surface 115.

The step 116 further includes a stepping surface 1164 and a connecting surface 1165. The stepping surface 1164 is parallel to the first surface 111. The connecting surface 1165 connects to the stepping surface 1164 and the first surface 111.

In at least one embodiment, the mounting bracket 20 is substantially square. The mounting bracket 20 includes a third surface 21, a fourth surface 22, a fourth side surface 23, a fifth side surface 24, a sixth side surface 25, and a seventh side surface 26. The third surface 21 is parallel with the first surface 111. The fourth surface 22 is opposite to the third surface 21. The fourth side surface 23 is opposite to the first side surface 113 and is perpendicularly connected to the third surface 21 and the fourth surface 22. The fifth side surface 24 is perpendicularly connected to the third surface 21, the fourth surface 22, and the fourth side surface 23. The sixth side surface 25 is opposite to the fourth side surface 23. The seventh side surface 26 is opposite to the fifth side surface 24.

A first receiving groove 27 is defined between the third surface 21 and the fourth surface 22. The first receiving groove 27 passes through the third surface 21 but does not pass through the fourth surface 22. The first receiving groove 27 receives the lens.

A second receiving groove 28 is defined between the fourth surface 22 and the third surface 21. The second receiving groove 28 is opposite to the first receiving groove 27 and is connected to the first receiving groove 27 by an opening 29. The second receiving groove 28 has a greater size that that of the first receiving groove 27. The first receiving groove 27 has a greater size than that of the opening 29. The second receiving groove 28 receives the sensor and the optical filter.

A flange 30 is defined on the fourth surface 22 of the mounting bracket 20. The flange 30 is located on the peripheral edge of the fourth surface 22 of the mounting bracket 20. In at least one embodiment, the flange 30 includes a first flanged portion 31, a second flanged portion 32, and a third flanged portion 33. The first flanged portion 31 abuts the fourth side surface 23 and is opposite to the sixth side surface 25. The second flanged portion 32 abuts the fifth side surface 24. The third flanged portion 33 abuts the seventh side surface 26. The flange 30 is opposite to and received in the step 116. The first flanged portion 31 is attached in the first stepping portion 1161 by the adhesive layer 40. The second flanged portion 32 is attached in the second stepping portion 1162 by the adhesive layer 40. The third flanged portion 33 is attached in the third stepping portion 1163 by the adhesive layer 40.

The flange 30 further includes an inwall 34 and a bottom surface 35 perpendicularly connected to the inwall 34. The bottom surface 35 faces the stepping surface 1164. The inwall 34 faces the connecting surface 1165. The adhesive layer 40 is attached on the stepping surface 1164, the connecting surface 1165, the inwall 34, and the bottom surface 35.

In other embodiments, the flange 30 can include just one or two of the first flanged portion 31, the second flanged portion 32, and the third flanged portion 33.

In at least one embodiment, the mounting bracket 20 is integrally formed with the flange 30. In other embodiments, the mounting bracket 20 also can be formed on the flange 30 by adhesive, screws, or the like.

The adhesive layer 40 is frame like in shape and is attached on the stepping surface 1164, the connecting surface 1165, the inwall 34, and the bottom surface 35. The material of the adhesive layer 40 is not limited. That is, the adhesive layer 40 can be an ordinary optical adhesive.

The optical filter is mounted on the bottom wall of the second receiving groove 28 or mounted on the bottom wall of the first receiving groove 27. The optical filter faces the lens and the sensor.

The sensor is electrically connected to the printed circuit board 10. The sensor can be a complementary metal oxide semiconductor (CMOS) chip or a charge coupled device (CCD) chip.

The camera module 100 further includes a reinforced adhesive 50. The reinforced adhesive 50 is mounted on the sixth side surface 25 of the mounting bracket 20 and the first surface 111 of the printed circuit board 10. The reinforced adhesive 50 enhances the mechanical strength of the camera module 100.

In at least one embodiment, the reinforced adhesive 50 is a UV reinforced adhesive. In other embodiment, the reinforced adhesive 50 also can be a heat-conducting adhesive to enhance heat dissipation from the camera module 100.

FIGS. 5-8 illustrate another embodiment of a camera module (camera module 200). The camera module 200 has a similar structure to that of the camera module 100. The difference between the camera module 200 and the camera module 100 is that the printed circuit board 10a of the camera module 200 does not form a step. That is, the step passes through the first surface 111a and the second surface 112a. The adhesive layer 40a is attached on connecting surface 1165a and the inwall 34a.

Figure 9:
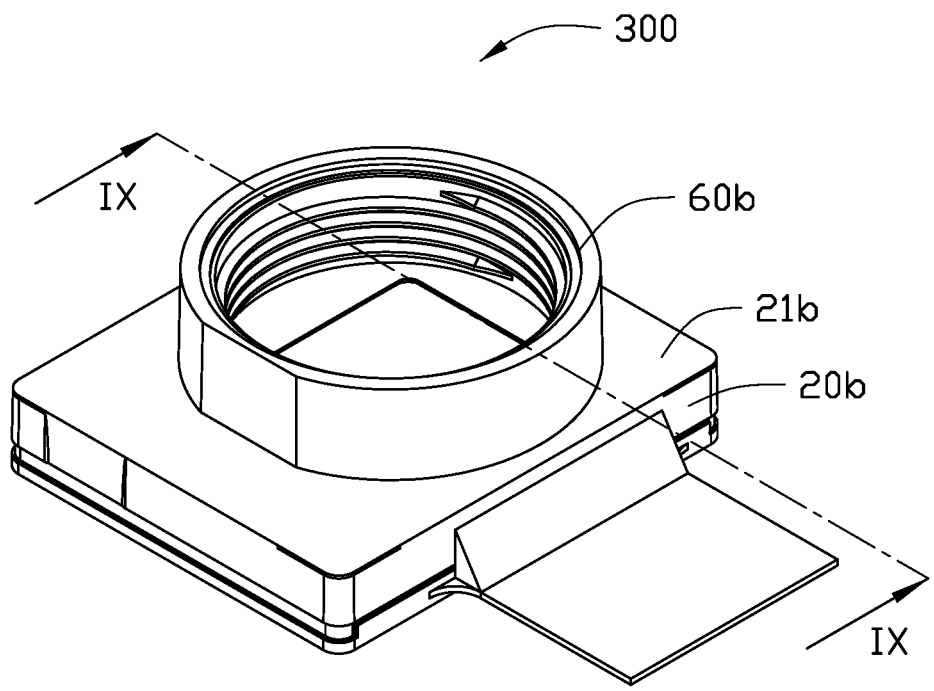
FIG. 9 is a perspective view of a third embodiment of a camera module according to the present disclosure.
Figure 10:
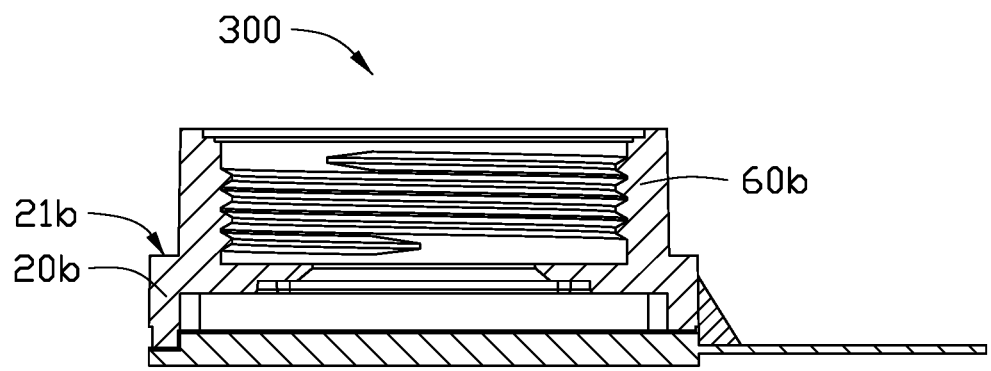
FIG. 10 is a cross-section view along line IX-IX of FIG. 8.

FIGS. 9-10 illustrate another embodiment of a camera module (camera module 300). The camera module 300 has a similar structure to that of the camera module 100. The difference between the camera module 300 and the camera module 100 is that the camera module 300 further includes a lens cone 60b. The lens cone 60b is mounted on the third surface 21b of the mounting bracket 20b. The lens (not shown) is received in the lens cone 60b.

Figure 11:
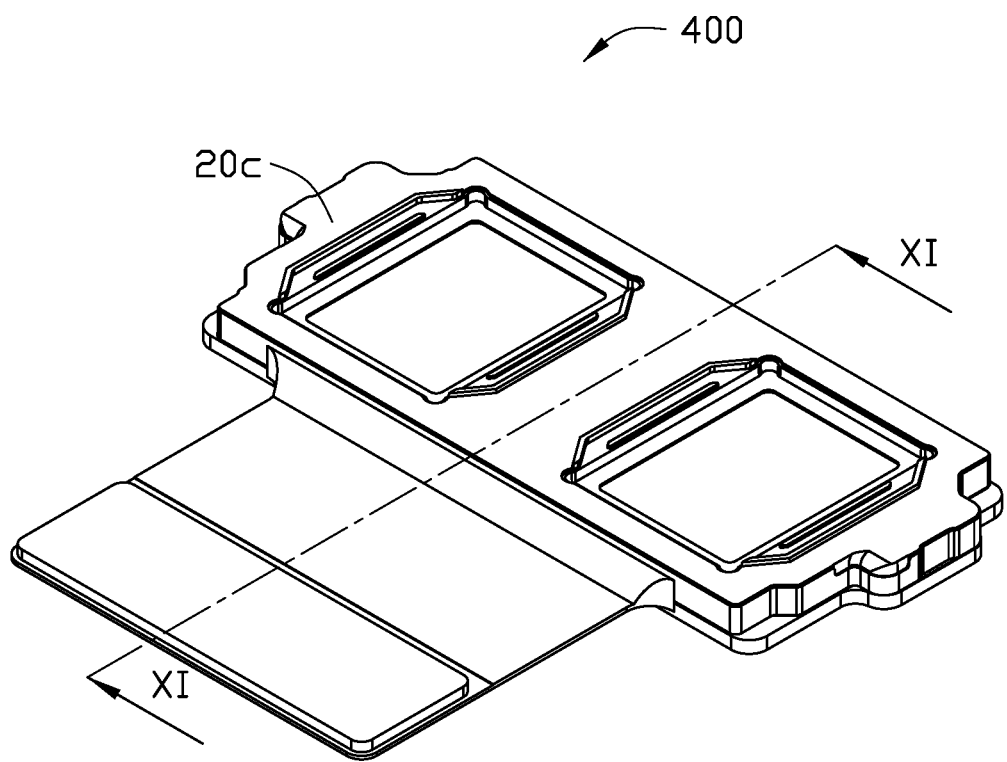
FIG. 11 is a perspective view of a fourth embodiment of a camera module according to the present disclosure.
Figure 12:
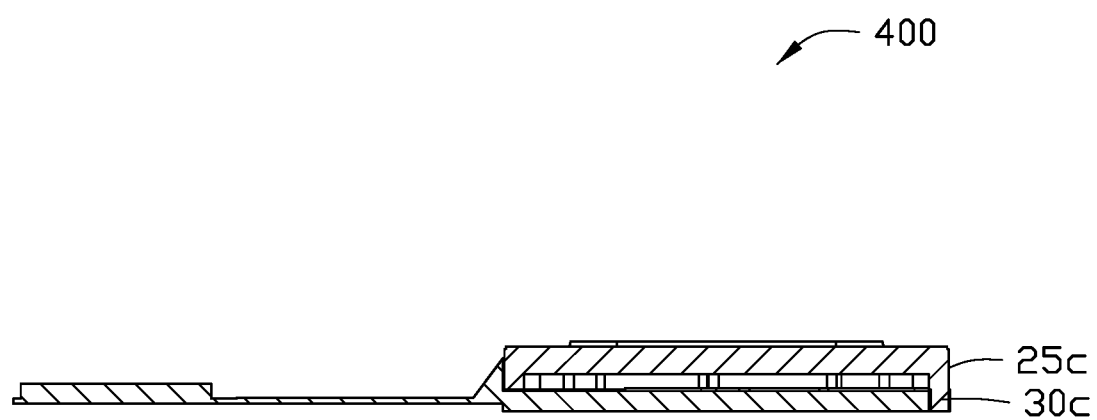
FIG. 12 is a cross-section view along line XI-XI of FIG. 11.

FIGS. 11-12 illustrate another embodiment of a camera module (camera module 400). The camera module 400 has a similar structure to that of the camera module 200. The difference between the camera module 400 and the camera module 200 is that the mounting bracket 20c of the camera module 400 is able to carry multiple lenses. In at least one embodiment, the mounting bracket 20c of the camera module 400 can mount two lenses. In at least one embodiment, the flange 30c just abuts the sixth side surface 25c.

In other embodiments, the flange 30c also can abut one of or both of the fifth side surface and the seventh side surface.

Figure 13:
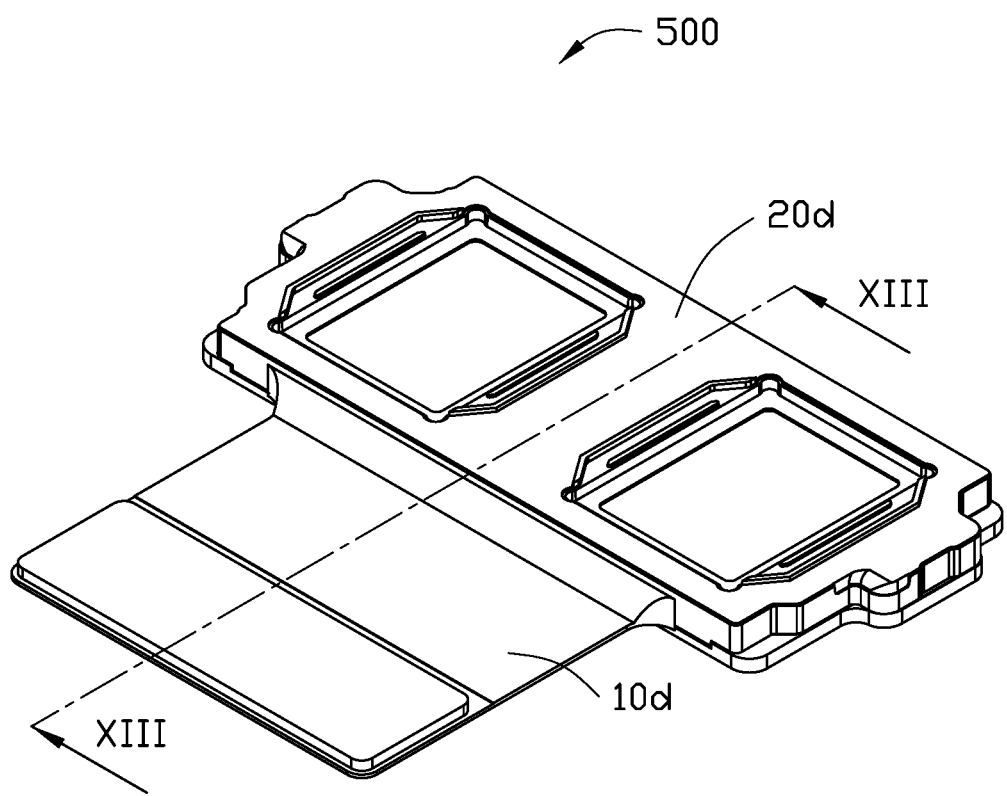
FIG. 13 is a perspective view of a fifth embodiment of a camera module according to the present disclosure.
Figure 14:
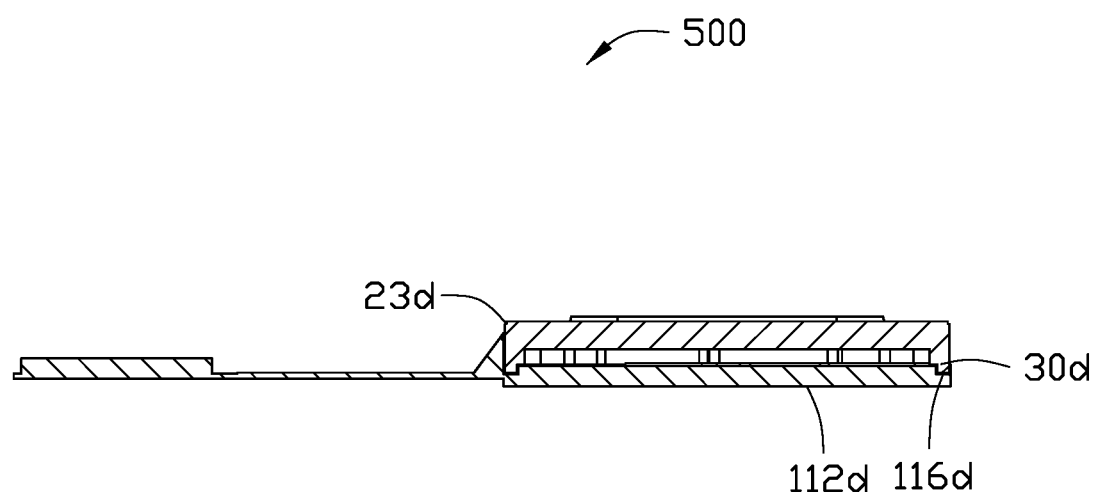
FIG. 14 is a cross-section view along line XIII-XIII of FIG. 13.

FIGS. 13-14 illustrate another embodiment of a camera module (camera module 500). The camera module 500 has a similar structure to that of the camera module 400. The difference between the camera module 500 and the camera module 400 is that the fourth flange 30d further abuts the fourth side surface 23d. The step 116d corresponds to the flange 30d. In at least one embodiment, the step 116d does not pass through the second surface 112d. In other embodiments, the step 116d also can pass through the second surface 112d.

In other embodiments, the step can be spaced gaps and the flange can be spaced bumps.

With the embodiments described above, the flange is defined on the fourth surface of the mounting bracket, the step corresponding to the flange is defined at the first rigid portion, and the flange is received and fixed in the step by the adhesive layer. Mechanical strength of the camera module 100 is enhanced, the camera module 100 has a reduced light leakage, and the stickiness of the adhesive material of the adhesive layer is less critical, thereby increasing the kinds of adhesive layer which can be used and reducing the cost of the camera module.

The embodiments shown and described above are only examples. Many details are often found in the art such as the other features of a camera module reduced light leakage. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A camera module with reduced light leakage comprising:
   a printed circuit board, the printed circuit board comprising a first surface and at least one side surface perpendicularly connected to the first surface; a step being defined at the printed circuit board, the step formed at an outer edge of the first surface of the printed circuit board and an outer edge of the at least one side surface of the printed circuit board; wherein the printed circuit board comprises a first rigid portion, the first rigid portion comprises a first side surface, a second side surface, and a third side surface; the first side surface is perpendicularly connected to the first surface, the second side surface is perpendicularly connected to the first surface and the first side surface, the third side surface is opposite to the second side surface; the step abuts the first side surface, the second side surface, and the third side surface;
   a mounting bracket mounted on the printed circuit board, a flange being defined on the mounting bracket; wherein the mounting bracket further comprises a fourth side surface, a fifth side surface, a sixth side surface, and a seventh side surface, the fourth side surface is opposite to the first side surface, the fifth side surface is perpendicularly connected to the fourth side surface, the sixth side surface is opposite to the fourth side surface, the seventh side surface is opposite to the fifth side surface; the flange is located on the peripheral edge of the mounting bracket and abuts the fourth side surface, the fifth side surface, and the sixth side surface; the flange is received and fixed in the step.

2. The camera module with reduced light leakage of claim 1, wherein the printed circuit board further comprises a second surface opposite to the first surface, the step passes through the second surface.

3. The camera module with reduced light leakage of claim 2, wherein the flange is received and fixed in the step by an adhesive layer, the step comprises a connecting surface, the connecting surface connects to the first surface, the flange comprises an inwall and a bottom surface perpendicularly connected to the inwall, the inwall faces the connecting surface, the adhesive layer is attached on the connecting surface and the inwall.

4. The camera module with reduced light leakage of claim 1, wherein the printed circuit board further comprises a second surface opposite to the first surface, the step does not pass through the second surface.

5. The camera module with reduced light leakage of claim 4, wherein the flange is received and fixed in the step by an adhesive layer, the step comprises a stepping surface and a connecting surface, the stepping surface is parallel to the first surface, the connecting surface connects the stepping surface and the first surface, the flange comprises an inwall and a bottom surface perpendicularly connected to the inwall, the bottom surface faces the stepping surface, the inwall faces the connecting surface, the adhesive layer is attached on the stepping surface, the connecting surface, the inwall, and the bottom surface.

6. The camera module with reduced light leakage of claim 1, wherein at least one first receiving groove is defined at the mounting bracket, the at least one lens is received in the at least one first receiving groove.

7. The camera module with reduced light leakage of claim 6, wherein a second receiving groove is defined at the mounting bracket, the second receiving groove is opposite to the first receiving groove and connects to the first receiving groove by an opening.

8. The camera module with reduced light leakage of claim 7, wherein the camera module with reduced light leakage further comprises an optical filter and a sensor, the optical filter is received in the second receiving groove, the sensor is mounted on the printed circuit board and received in the second receiving groove, and the optical filter is positioned between the lens and the sensor.

9. The camera module with reduced light leakage of claim 1, wherein the camera module with reduced light leakage further comprises a reinforced adhesive; the reinforced adhesive is mounted on mounting bracket and the printed circuit board.

10. The camera module with reduced light leakage of claim 6, wherein the printed circuit board further comprises a second rigid portion and a flexible portion, the flexible portion is located between the first rigid portion and the second rigid portion; the step further abuts the flexible portion, the flange further abuts the flexible portion.

11. An electronic device, comprising:
   a camera module, the camera module comprising:
   a printed circuit board, the printed circuit board comprising a first surface and at least one side surface perpendicularly connected to the first surface; a step being defined at the printed circuit board, the step formed at an outer edge of the first surface of the printed circuit board and an outer edge of the at least one side surface of the printed circuit board; wherein the printed circuit board comprises a first rigid portion, the first rigid portion comprises a first side surface, a second side surface, and a third side surface; the first side surface is perpendicularly connected to the first surface, the second side surface is perpendicularly connected to the first surface and the first side surface, the third side surface is opposite to the second side surface; the step abuts the first side surface, the second side surface, and the third side surface;

a mounting bracket mounted on the printed circuit board, a flange being defined on the mounting bracket; wherein the mounting bracket further comprises a fourth side surface, a fifth side surface, a sixth side surface, and a seventh side surface, the fourth side surface is opposite to the first side surface, the fifth side surface is perpendicularly connected to the fourth side surface, the sixth side surface is opposite to the fourth side surface, the seventh side surface is opposite to the fifth side surface; the flange is located on the peripheral edge of the mounting bracket and abuts the fourth side surface, the fifth side surface, and the sixth side surface; the flange is received and fixed in the step.

12. The electronic device of claim 11, wherein the printed circuit board further comprises a second surface opposite to the first surface, the step passes through the second surface.

13. The electronic device of claim 12, wherein the flange is received and fixed in the step by an adhesive layer, the step comprises a connecting surface, the connecting surface connects to the first surface, the flange comprises an inwall and a bottom surface perpendicularly connected to the inwall, the inwall faces the connecting surface, the adhesive layer is attached on the connecting surface and the inwall.

14. The electronic device of claim 11, wherein the printed circuit board further comprises a second surface opposite to the first surface, the step does not pass through the second surface.

15. The electronic device of claim 14, wherein the flange is received and fixed in the step by an adhesive layer, the step comprises a stepping surface and a connecting surface, the stepping surface is parallel to the first surface, the connecting surface connects the stepping surface and the first surface, the flange comprises an inwall and a bottom surface perpendicularly connected to the inwall, the bottom surface faces the stepping surface, the inwall faces the connecting surface, the adhesive layer is attached on the stepping surface, the connecting surface, the inwall, and the bottom surface.

16. The electronic device of claim 11, wherein at least one first receiving groove is defined at the mounting bracket, at least one lens is received in the at least one first receiving groove; a second receiving groove is defined at the mounting bracket, the second receiving groove is opposite to the first receiving groove and connects to the first receiving groove by an opening.

17. The electronic device of claim 16, wherein the camera module with reduced light leakage further comprises an optical filter and a sensor, the optical filter is received in the second receiving groove, the sensor is mounted on the printed circuit board and received in the second receiving groove, and the optical filter is positioned between the lens and the sensor.

* * * * *